United States Patent [19]
Gabbrielli et al.

[11] Patent Number: 5,856,067
[45] Date of Patent: Jan. 5, 1999

[54] CONTACT PHOTOLITHOGRAPHIC PROCESS FOR REALIZING METAL LINES ON A SUBSTRATE BY VARYING EXPOSURE ENERGY

[75] Inventors: Barbara Gabbrielli, Milan; Osvaldo Crippa, Arcore, both of Italy

[73] Assignee: Alcatel Italia S.P.A., Milan, Italy

[21] Appl. No.: 561,264

[22] Filed: Nov. 21, 1995

[30] Foreign Application Priority Data

Dec. 20, 1994 [IT] Italy .................................. MI94A2565

[51] Int. Cl.⁶ ...................................................... G03C 5/00
[52] U.S. Cl. .............................. 430/311; 430/5; 430/326; 430/329; 430/330
[58] Field of Search ............................... 430/5, 296, 326, 430/311, 330, 329

[56] References Cited

U.S. PATENT DOCUMENTS

| | | | |
|---|---|---|---|
| 5,178,986 | 1/1993 | Zampini et al. | 430/190 |
| 5,178,989 | 1/1993 | Zampini et al. | 430/190 |
| 5,242,770 | 9/1993 | Chen et al. | 430/5 |

FOREIGN PATENT DOCUMENTS

| | | |
|---|---|---|
| 0384145 | 8/1990 | European Pat. Off. . |
| 2529054 | 6/1977 | Germany . |
| 58-159326 | 9/1983 | Japan . |

OTHER PUBLICATIONS

Mack, C.A. "Understanding focus effects in submicrometer optical lithography: a review", Opt. Eng. Oct. 1983 vol. 32, No. 10, pp. 2350–2362.

"Image Reversal Photoresist," by Eric Alling et al., Solid State Technology, vol. 31, No. 6, Jun. 1988, pp. 37–38.

"Patent Abstracts of Japan" Application #01083237, Suzuki et al. Resist Patern Forming Method, Oct. 24, 1990.

"Image Reversal Lift–Off Process," IBM Technical Disclosure Bulletin, Mar. 1982.

"Patent Abstracts of Japan," Application No. 58015705, Tanaka et al., Formation of Fine Pattern, Aug. 13, 1984.

"Lift–Off Fabric of Fine Cu Patterns with a High Aspect Ratio," Yuitoo et al., Electronics and Communications in Japan, Part 2 vol. 74, No. 8, 1991, pp. 79–87.

*Primary Examiner*—Janet Baxter
*Assistant Examiner*—Rosemary Ashton
*Attorney, Agent, or Firm*—Ware, Fressola, Van Der Sluys & Adolphson LLP

[57] ABSTRACT

The present invention concerns a contact photolithographic process for realizing submicrometer metal lines, in particular lines for devices such as FETs, MESFETs and ICs, with width different from the pattern width on the masks, through contact photolithographic techniques. In particular through this technique it is possible to realize metal lines having width smaller than 0.5 μm. By varying the reversal photoresist exposure energy it is possible to control the dimension of the line to be realized. Using an exposure energy lower than the one normally used, lines having width smaller than the width of the corresponding tracks on the mask are obtained and vice versa, with an exposure energy higher than the one normally used, lines having width greater than the corresponding tracks on the mask are obtained.

12 Claims, 4 Drawing Sheets

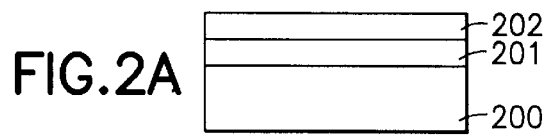
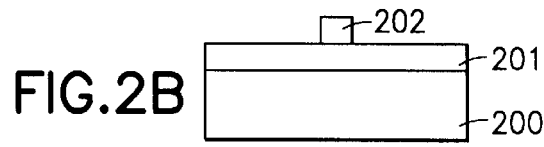
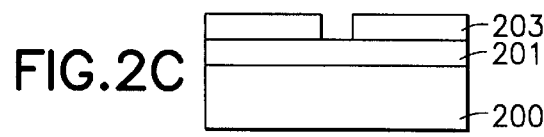
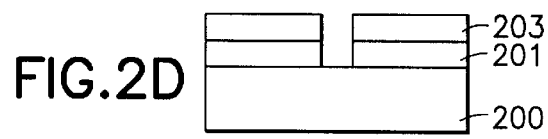
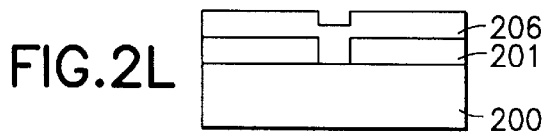
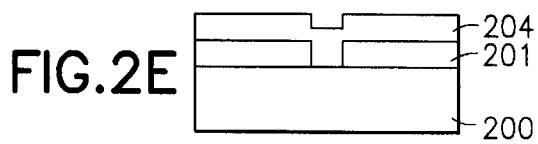
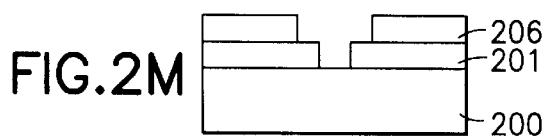
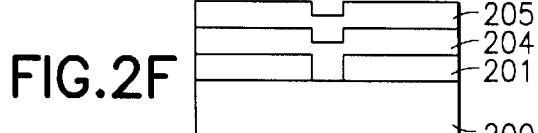
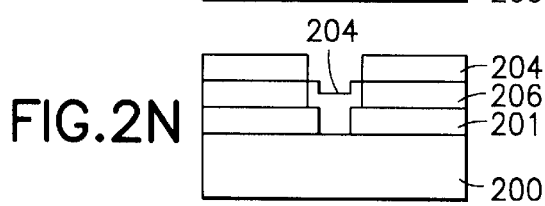
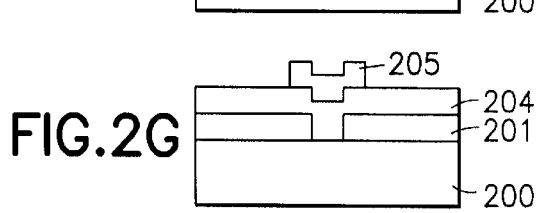
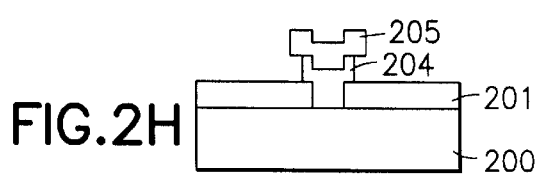
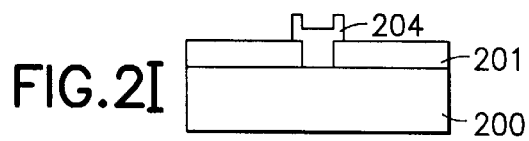

COATING

BACKING

EXPOSURE

REHEATING

TOTAL EXPOSURE

DEVELOPING

CONTACT PHOTOLITHOGRAPHIC PROCESS FOR REALIZING METAL LINES ON A SUBSTRATE BY VARYING EXPOSURE ENERGY

TECHNICAL FIELD

The present invention concerns a contact photolithographic process suitable for the realization of metal lines on a substrate covered with reversal photoresist and exposed to light through a mask reproducing the pattern of the lines. The process of the present invention is, in particular, suitable for realizing lines for devices such as Field Effect Transistors (FETs), Metal Semiconductor Field Effect Transistors (FETs) and Integrated Circuits.

BACKGROUND OF THE INVENTION

The known contact photolithographic techniques allow the achievement of metal lines less than 1 $\mu$m width on a substrate, with very good yields. However, when lines less 0.5 $\mu$m width are desired, these techniques are unsuitable because of intrinsic limitations of the technique itself. In order to overcome this limitation, various methods and technologies based upon, e.g., the use of electronic beams or X-rays are used, which require very expensive and complex equipment as well as complex and expensive facilities for the realization and control of the process.

DISCLOSURE OF INVENTION

It is an object of the invention to overcome the drawbacks of the known art by realizing a process which allows the achievement of metal lines, even less than 0.5 $\mu$m width, on a substrate and nevertheless is simple, high yield and cheap both in terms of initial as well as working and maintenance investments.

According to the present invention, a contact photolithographic process for realizing metal lines on a substrate which is coated with reversal photoresist and exposed to light through a mask for reproducing a pattern of such lines is characterized in that the ratio of the line width to be realized to the width of the corresponding tracks on the mask is varied by acting on the exposure energy.

In further accord with the present invention, in order to obtain on the substrate metal lines having a width smaller than the width of the corresponding tracks on the mask, an exposure energy is used lower than the exposure energy necessary for obtaining lines whose width is equal to the width of the corresponding tracks.

According further to the present invention, in order to obtain on the substrate metal lines having a width greater than the width of the corresponding tracks on the mask, an exposure energy is used higher than the energy used for obtaining lines having the same width as the corresponding tracks.

In still further accord with the present invention, in order to obtain on the substrate metal lines having a width smaller than the width of the corresponding tracks on the mask, the exposure energy used is preferably comprised between 20 and 28 mJ.

According further to the present invention, in order to obtain on the substrate metal lines having a width greater than the one of the corresponding tracks on the mask, the exposure energy is preferably comprised between 200 and 300 mJ.

Still further in accord with the present invention, the contact photolithographic process comprises the steps of applying the reversal photoresist coating on the substrate, baking the photoresist at a temperature between 70 and 90 degrees C. for about 30 minutes, contact photolithographically exposing masks using exposure energy comprised between 20 and 28 mJ having an exposure spectrum centered around 400 nm, reheating the photoresist at a temperature comprised between 100 and 120 degrees C. for about five minutes, totally exposing the photoresist with an exposure energy comprised between 2,000 and 2,800 mJ, and developing the photoresist.

Further still in accordance with the present invention, the contact photolithographic process comprises the steps of applying the reversal photoresist coating on the substrate, baking the photoresist at a temperature comprised between 70 and 90 degrees C. for 30 minutes, contact photolithographically exposing masks using exposure energy comprised between 200 and 300 mJ and an exposure spectrum centered around 400 nm, reheating the photoresist at a temperature comprised between 100 and 120 degrees C. for about five minutes, totally exposing the photoresist with an exposure energy comprised between 2,000 and 2,800 mJ, and developing the photoresist.

By varying the exposure energy of the reversal photoresist, the dimension of the line to be realized can be controlled. Using an exposure energy less than the one normally used, lines having width less than the corresponding tracks on the mask are obtained. Using an exposure energy higher than the one normally used, lines having width larger than the corresponding tracks on the mask are obtained. In particular, using masks having tracks 0.5 $\mu$m width, it is possible to obtain, in accordance with the invention, lines 0.25 $\mu$m width with high production yields and with techniques not so expensive and complex as the prior art techniques.

Moreover, still with the same technique, by varying some process parameters only, it is possible to obtain lines up to 1.2 $\mu$m also through the same masks. Therefore, with only one set of mask it is possible to obtain lines with different widths plus with simple and cheaper techniques besides. In particular, very small dimensioned lines can be obtained without the need of special equipment and processes.

These and other objects, features and advantages of the present invention will become more apparent in light of the following detailed description of a best mode embodiment thereof, as illustrated in the accompanying drawing.

BRIEF DESCRIPTION OF THE DRAWING

FIGS. 2A to 2N represent the process steps for realizing the so-called mushroom lines; according to the invention

Figure 3A:
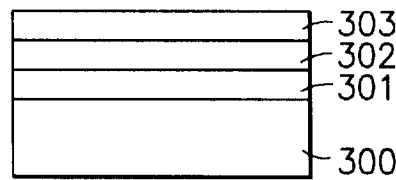
FIGS. 3A to 3H represent the process steps for realizing the so-called mushroom lines with self-alignment of the structure according to the invention.
Figure 3B:
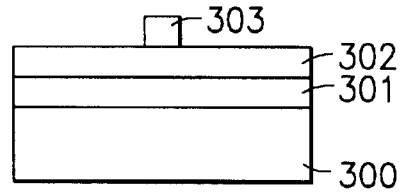
Figure 3C:
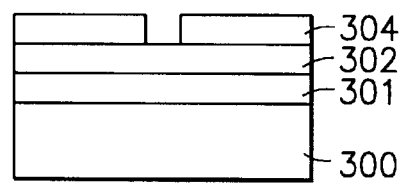
Figure 3D:
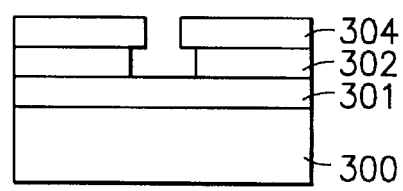
Figure 3E:
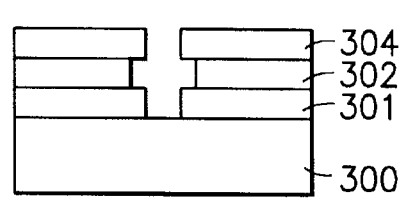
Figure 3F:
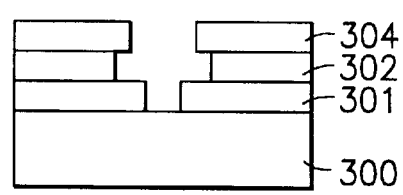
Figure 3G:
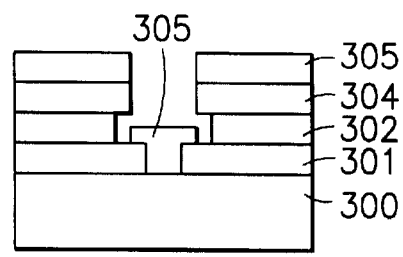
Figure 3H:
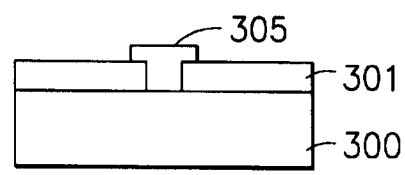
Figure 4A:
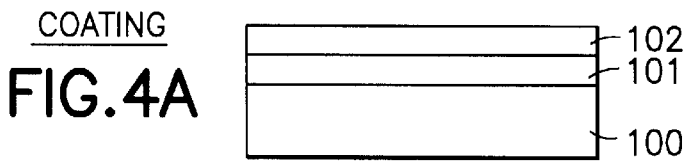
FIG. 4 shows the steps for preparing the substrate in accordance with the present invention.
Figure 4B:
Figure 4C:
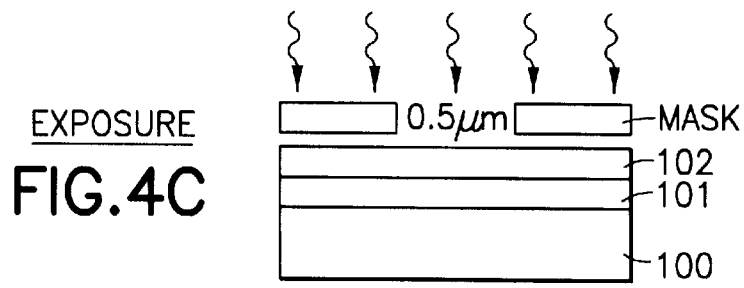
Figure 4D:
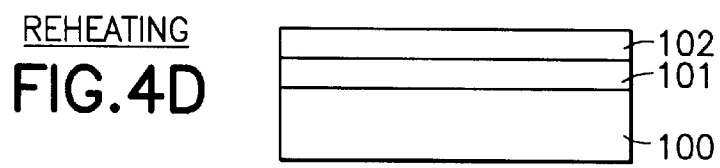
Figure 4E:
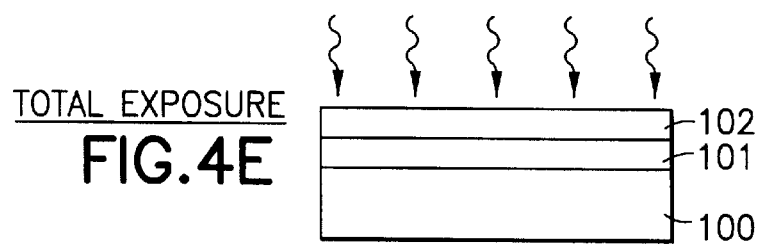
Figure 4F:
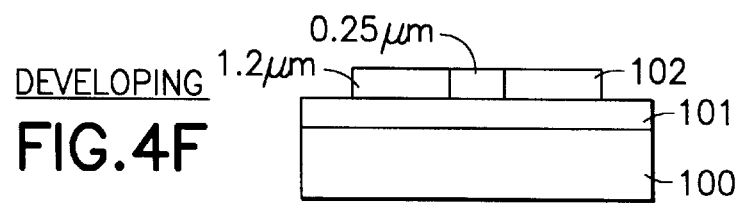

A self-aligned process is a process in which only one masking is carried out to obtain a geometry with a mushroom structure like the one shown in FIG. 3H.

BEST MODE FOR CARRYING OUT THE INVENTION

The process will now be described through a preferred realization of metal lines to obtain lines 0.25 $\mu$m width using 0.5 μm mask patterns, and subsequently three application processes are described in connection with the realization of standard lines, mushroom lines for decreasing the electrical resistance and another mushroom line with self-alignment of the structure.

The following steps are those strictly necessary for preparing the substrate in order to obtain the desired lines, as shown in FIG. 4.

a) Depositing on the substrate or wafer a reversal-photoresist, like a dual tone photoresist composed by a 1-Methoxy- 2-Propanol acetate base plus a modified Novolak resin, produced and commercialized by Olin-Ciba Geigy company, which is a well known product by spinner, i.e. by rotating the substrate at a speed of 6,500 RPM for 30 seconds, for example, so as to obtain the coating of the substrate with a uniform layer of photoresist.

b) Baking the photoresist at a temperature comprised between 70 and 90 C. degrees for about 30 min in a forced-air furnace. Optimal value for 0.25 μm lines: 80 C. degrees.

c) Contact-photolithography by using one set of masks having a pattern of tracks on the order of 0.5 μm width, with an exposure spectrum centered around 400 nm and with an exposure energy comprised between 20 and 28 mJ for 0.25 μm lines and comprised between 200 and 300 mJ for 1.2 μm lines. The ratio of the metal line width to be realized to the width of corresponding tracks on the mask is varied and depends on the exposure energy.

Optimal values are 24 mJ (8 mW/sq.cm. for 3 seconds) in the first case, and 256 mJ (8 mW/sq. cm. for 32 seconds) in the second case. Normally, an exposure energy of about 120 mJ is used for obtaining lines having the same width as the corresponding tracks on the masks.

d) Reheating of the photoresist at a temperature comprised between 100 and 120 C. degrees for a time comprised between 2.5 minutes and 7.5 minutes. Optimal value for 0.25 μm lines: 110 C. degrees for 5 minutes.

e) Total exposure of the photoresist with an exposure energy comprised between 2,000 and 2,800 mJ. Optimal value: 2,400 mJ (8 mW/sq.cm. for 300 seconds).

f) Developing the masking with a standard alkaline solution having normality equal to 0.45, carried out through two dippings of about 55 seconds and 12 seconds, in order to remove the resist from the desired regions. The complete process for realizing the metal lines on the substrate comprises following steps of multilayer standard masking.

With reference to FIGS. 1A to 1F, the complete process for realizing standard lines comprises the following steps:

A first layer 101 of positive photoresist is applied on the substrate 100 and the required bakings for eliminating solvents and curing the resist are carried out.

Figure 1A:
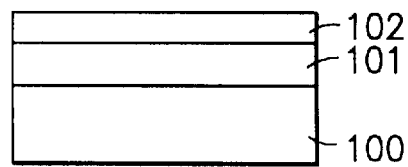
FIGS. 1A to 1F represent the process steps for realizing standard lines, according to the invention.
Figure 1B:
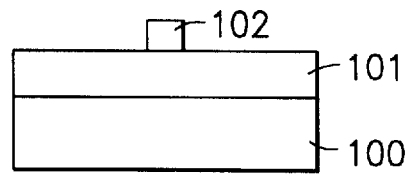

A second layer 102 of reversal photoresist is placed over and the steps b) to f) described above are carried out, as described above with reference to FIG. 4. A structure as shown in FIG. 1B is thus obtained.

Figure 1C:
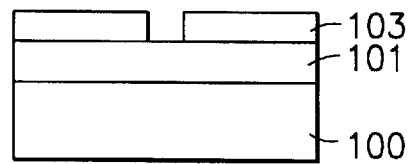
Figure 1D:
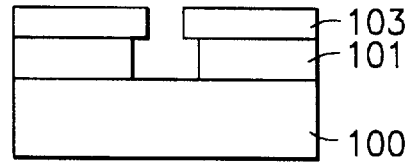
Figure 1E:
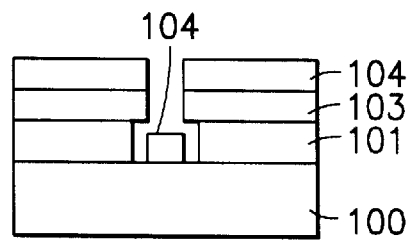
Figure 1F:
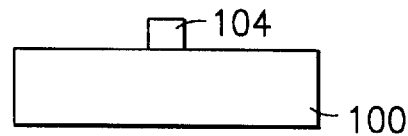

Through a first evaporation, realized with electron gun in high vacuum, the front of the wafer is thin metallized so as to obtain a metal layer 103 to be used as a mask in the course of the process. Then the photoresist 102 is removed and the structure shown in FIG. 1C is obtained. Through a dry etching of type RIE, i.e. an etching realized through plasma with reactive gas (oxygen) in a chamber with parallel flat plates and with RF feeding, a portion of the photoresist 101 is etched away thus obtaining a structure as shown in FIG. 1D. Through a second evaporation carried out similarly to the previous one, a metallization 104 is deposited on the entire front of the wafer obtaining a structure as shown in FIG. 1E. Then layers 101, 103 and the upper part of the layer 104 are removed by a suitable solvent to obtain the structure of FIG. 1F.

The complete process for realizing the so-called mushroom lines comprises the following steps, with reference to FIGS. 2A to 2N.

A first layer 201 of silicon nitride is deposited on the substrate 200.

A first layer 202 of reversal photoresist is placed over and the steps b) to f) described above are carried out, as described above with reference to FIG. 4. A structure as shown in FIG. 2B is thus obtained.

Through a first evaporation as above the front of the wafer is thin metallized so as to obtain a layer 203 of metal to be used as a mask in the course of the process.

Then the photoresist 202 is removed and the structure shown in FIG. 2C is obtained.

Through a dry etching of type RIE, like the previous one but using a different gas (Freon 14), part of the silicon nitride 201 is etched away thus obtaining a structure as shown in FIG. 2D After step 2D and before steps 2E or 2L, the layer 203 is removed with a suitable solution for the respective metal applied.

At this point it is possible to follow two different ways which are equivalent:

The first one requires a second evaporation which deposits a metallization 204 on the entire front of the wafer as shown in FIG. 2E. A second layer 205 of reversal photoresist is placed over. A second masking is carried out to obtain lines about 1.2 μm width, according to what described above, to obtain the structure of FIG. 2G. A wet etching with suitable solution for metals deposited by metallization 204 (FIG. 2H) is carried out and the second layer 205 of reversal photoresist is removed to obtain the structure of FIG. 2I.

The second way is followed by applying a second layer 206 of positive photoresist as shown in FIG. 2L. A second masking is carried out to obtain lines 0.5 to 0.8 μm width according to conventional techniques to obtain the structure of FIG. 2M. Through a second evaporation, metallization 204 is deposited (FIG. 2N) and then the second layer 206 of photoresist along with the metallization 204 placed over, are removed.

The complete process for realizing the so-called mushroom lines with self-aligning of the structure is composed of the following steps with reference to FIGS. 3A to 3H.

On the substrate 300, a thin layer 301 of silicon nitride is deposited through a plasma technique, a first layer 302 of positive photoresist 302 is placed over and the bakings for curing this layer are-carried out.

A second layer 303 of reversal photoresist is applied and steps b) to f) are carried out as described above, as described above with reference to FIG. 4. At the end, a structure as shown in FIG. 3B is obtained. Through a first evaporation the front of the wafer is thin metallized so as to obtain a metal layer 304 to be used as a mask in the course of the process. Then the photoresist 303 is removed and the structure of FIG. 3C is obtained. Through a dry etching of type RIE as in the previous process, part of photoresist 302 is removed thus obtaining the structure as shown in FIG. 3D. Through a dry etching still using the RIE technique with freon 14 gas, the silicon nitride 301 is etched away as shown in FIG. 3E. Then materials are partially removed by RIE technique to obtain the widening of layers 302 and 304 as shown in FIG. 3F.

Through a second evaporation a metal layer 305 is deposited on the entire front of the wafer as shown in FIG. 3G. The layers 302, 304 and the upper portion of layer 305 are removed by a suitable solvent to obtain the structure of FIG. 3H.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A contact photolithographic process for producing metal lines on a substrate which is coated with reversal photoresist and exposed to light through a mask reproducing a pattern of the metal lines, wherein the process comprises the steps of:

preparing the substrate by exposing the reversal photoresist to an exposure energy having a value determined by a desired ratio between a line width to be obtained on the substrate and a width of the pattern on the mask; and applying a multilayer standard masking to the substrate to form the metal lines.

2. A contact photolithographic process according to claim 1, wherein in order to obtain the metal lines on the substrate having a width smaller than the width of corresponding tracks on the mask, the step of preparing the substrate includes using a lower exposure energy than the exposure energy necessary for obtaining metal lines whose width is equal to the width of the corresponding tracks.

3. A contact photolithographic process according to claim 2, wherein the step of preparing the substrate further comprises the following steps:

(a) depositing the reversal photoresist coating on the substrate;

(b) baking the reversal photoresist at a temperature in a range of 70 to 90 C. degrees for about 30 minutes;

(c) performing contact photolithography by using one set of masks with exposure energy in a range of 20 to 28 mJ and an exposure spectrum centered around 400 nm;

(d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

4. A contact photolithographic process according to claim 1, wherein in order to obtain the metal lines on the substrate having a width greater than the width of corresponding tracks on the mask, the step of preparing the substrate includes using a higher exposure energy than the energy used for obtaining lines having the same width as the corresponding tracks.

5. A contact photolithographic process according to claim 4, wherein the step of preparing the substrate further comprises the following steps:

(a) depositing the reversal photoresist coating on the substrate;

(b) baking the reversal photoresist at a temperature in a range of 70 to 90 C. degrees for 30 minutes;

(c) performing contact photolithography by using one set of masks with exposure energy in a range of 200 to 300 mJ and an exposure spectrum centered around 400 nm;

(d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

6. A contact photolithographic process according to claim 1, wherein the step of preparing the substrate includes providing the exposure energy in a range between 20 and 28 mJ.

7. A contact photolithographic process according to claim 6, wherein the step of preparing the substrate further comprises the following steps:

(a) depositing the reversal photoresist coating on the substrate;

(b) baking the reversal photoresist at a temperature in a range of 70 to 90 C. degrees for about 30 minutes;

(c) performing contact photolithography by using one set of masks with exposure energy in a range of 20 to 28 mJ and an exposure spectrum centered around 400 nm;

(d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

8. A contact photolithographic process according to claim 1, wherein the step of preparing the substrate includes providing the exposure energy in a range between 200 and 300 mJ.

9. A contact photolithographic process according to claim 8, wherein the step of preparing the substrate further comprises the following steps:

(a) depositing the reversal photoresist coating on the substrate;

(b) baking the reversal photoresist at a temperature in a range of 70 to 90 C. degrees for about 30 minutes;

(c) performing contact photolithography by using one set of masks with exposure energy in a range of 200 to 300 mJ and an exposure spectrum centered around 400 nm;

(d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

10. A contact photolithographic process according to claim 1, wherein the step of preparing the substrate further comprises the following steps:

(a) depositing the reversal photoresist coating on the substrate;

(b) baking the reversal photoresist at a temperature in a range of 70 to and 90 C. degrees for about 30 minutes;

(c) performing contact photolithography by using one set of masks with exposure energy in a range of 20 to 28 mJ and an exposure spectrum centered around 400 nm;

d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

11. A contact photolithographic process according to claim 1, wherein the step of preparing the substrate further comprises the following steps:

(a) depositing the reversal photoresist coating on the substrates;

(b) baking the reversal photoresist at a temperature in a range of 70 to 90 C. degrees for 30 minutes;

(c) performing contact photolithography by using one set of masks with exposure energy in a range of 200 to 300 mJ and an exposure spectrum centered around 400 nm;

(d) re-heating the reversal photoresist at a temperature in a range of 100 to 120 C. degrees for about 5 minutes;

(e) totally exposing the reversal photoresist with a total exposure energy in a range of 2,000 to 2,800 mJ; and (f) developing the reversal photoresist.

12. A contact photolithographic process according to claim 1, wherein the step of applying the multilayer standard masking comprises the following steps:

providing a first metal layer to the substrate to be used as a mask;

removing the reversal photoresist;

using a dry etching;

providing a second metal layer to the entire surface of the substrate; and removing the first metal layer and the second metal layer to obtain the metal lines.

* * * * *

UNITED STATES PATENT AND TRADEMARK OFFICE
CERTIFICATE OF CORRECTION

PATENT NO. : 5,856,067
DATED : January 5, 1999
INVENTOR(S) : Gabbrielli et al.

It is certified that error appears in the above-identified patent and that said Letters Patent is hereby corrected as shown below:

<u>Title page,</u>
Item [56], References Cited, U.S. PATENT DOCUMENTS, please delete
"5,178,989    1/1993  Zampini et al. .................. 430/190".

<u>Column 6,</u>
Line 51, please delete "and".
Line 55, please delete "d)" and insert -- (d) --.

Signed and Sealed this

Seventeenth Day of December, 2002

JAMES E. ROGAN
*Director of the United States Patent and Trademark Office*